United States Patent [19]

Glover et al.

[11] Patent Number: 4,982,847
[45] Date of Patent: Jan. 8, 1991

[54] PRINTED WIRING BOARD STAND-OFF GUIDE

[75] Inventors: Alfred H. Glover, Decatur; Joseph T. Betterton, Arab; Bruce Hepler, Huntsville, all of Ala.

[73] Assignee: Acustar, Inc., Troy, Mich.

[21] Appl. No.: 434,736

[22] Filed: Nov. 13, 1989

[51] Int. Cl.$^5$ .............................................. A47F 7/00
[52] U.S. Cl. ...................................... 211/41; 361/415
[58] Field of Search .................. 211/41; 361/397, 399, 361/398, 415

[56] References Cited

U.S. PATENT DOCUMENTS

| | | | |
|---|---|---|---|
| 3,950,057 | 4/1976 | Calabro | 211/41 X |
| 4,580,192 | 4/1986 | Beun | 211/41 X |
| 4,706,819 | 11/1987 | Elliott | 211/41 |
| 4,762,689 | 8/1988 | Frey et al. | 211/41 X |

*Primary Examiner*—Robert W. Gibson, Jr.
*Attorney, Agent, or Firm*—Kenneth H. MacLean, Jr.

[57] ABSTRACT

A board guide assembly (10) includes a printed wiring board (12) which is maintained at predetermined horizontal and vertical positions by a pair of guide mechanisms (42). The guide mechanism (42) includes a lower guide member (48) having a ramped upper surface to guide the board (12) upwards to the predetermined vertical position and an upper guide member (50) having a downwardly ramped lower surface to guide the board (12) downwardly to the predetermined vertical position between the upper and lower guide members (50, 48) and clamped therebetween. A deformable insert (46) is located between the upper and lower guide members (50, 48) to be inserted within a notch (22, 24) in the board (12). The insert (16) includes tabs (72, 74) extending therefrom on opposite sides and spaced apart along the insert (46) to provide force on the board (12) to position in the predetermined horizontal position.

10 Claims, 2 Drawing Sheets

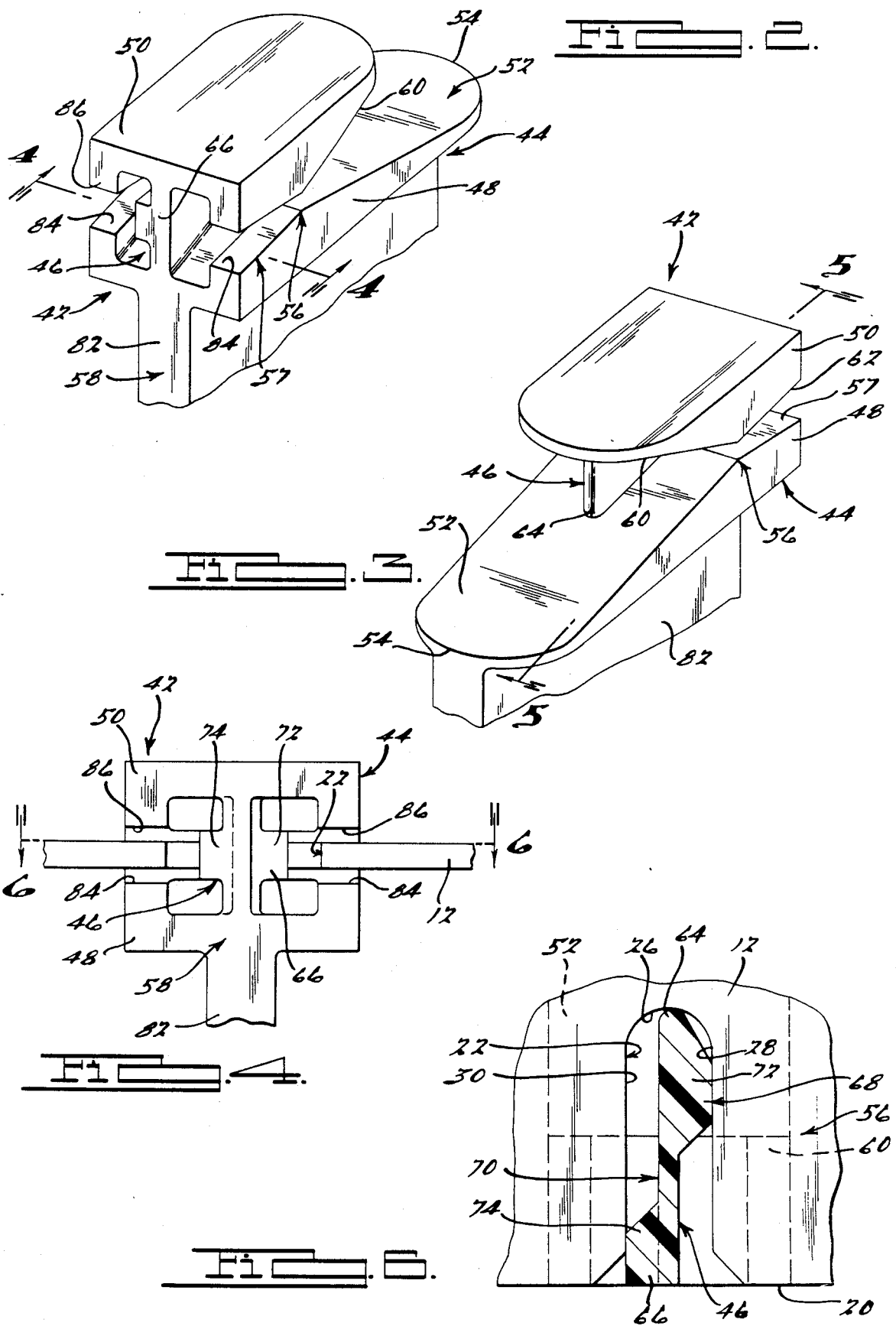

PRINTED WIRING BOARD STAND-OFF GUIDE

TECHNICAL FIELD

The invention relates to clamps used to position and retain printed wiring boards.

BACKGROUND ART

With the automation of electronic related products, printed wiring boards are used to support electronics which interact with other electronics or electro-mechanical devices. Such printed wiring boards must be attached to the machinery at exact positions for electrical connections therebetween. Printed wiring boards include apertures or slots for fastening the printed wiring board to the machinery. However, positioning is sometimes nonprecise by the assembler and securing by fasteners is sometimes cumbersome while attempting to maintain the printed wiring board properly positioned.

In one particular application, a combination speedometer-odometer assembly has required a printed wiring board which is assembled in an automated manner. The printed wiring board allows reception of a signal from a transducer on the outdrive of the engine relating to vehicle speed, and the board produces a useful signal to a stepper motor or the like which positions the pointer dial of the speedometer for speed indication. In the manufacturing of such assemblies, it is desirable to provide a quick and simple positioning in order to secure the printed wiring board to the mechanical device. Previously, such positioning has been accomplished manually.

SUMMARY OF THE INVENTION AND ADVANTAGES

The invention concerns a board guide assembly for receiving a board and aligning the board along a horizontal plane and a vertical plane. The assembly includes guide means for supporting the board in a predetermined position. The guide means includes vertical positioning means for receiving and guiding the board to a predetermined vertical position and horizontal positioning means for receiving and guiding the board to a predetermined horizontal position.

An advantage is that the printed wiring board may be accurately positioned and clamped at one edge until the opposite edge of the board is secured by fasteners. Thereafter, the guide means clamps one edge of the board to prevent deformation of the board and external vibration or noise from effecting it.

BRIEF DESCRIPTION OF THE DRAWINGS

Other advantages of the present invention will be readily appreciated as the same becomes better understood by reference to the following detailed description when considered in connection with the accompanying drawings wherein:

FIG. 2 is a rear perspective view of the guide means;

FIG. 3 is a frontal perspective view of the guide means;

FIG. 4 is a view of the guide means taken along lines 4—4 of FIG. 2;

FIG. 6 is a partially cut away view of the guide means and the printed wiring board taken along lines 6—6 of FIG. 5.

DESCRIPTION OF THE PREFERRED EMBODIMENT

Figure 1:
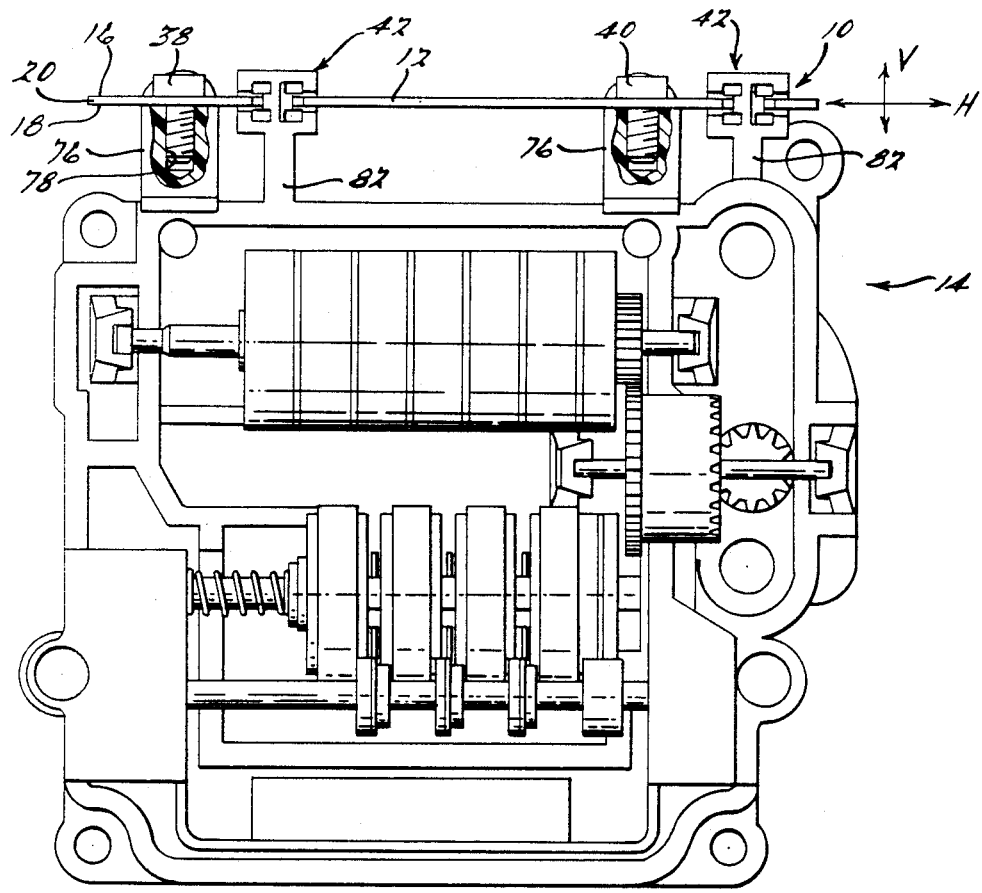
FIG. 1 is a combination speedometer-odometer assembly utilizing the subject invention.

A printed circuit board guide assembly for receiving and aligning board means along a horizontal plane H and a vertical plane V is generally illustrated at 10 in FIG. 1. The board guide assembly 10 is adapted to be integral with or attached to a speedometer-odometer assembly 14 for communicating electrical signals therebetween.

The board guide assembly 10 receives and aligns a board means 12 having upper 16 and lower 18 flat, parallel sides or surfaces. The board means 12 is generally a rectangular-shaped printed wiring board as commonly known in the art to which electrical devices are attached and wired. The printed wiring board 12 includes a first edge 20 which has two notches 22 (one of which is shown in FIG. 6) formed therein. Each notch 22 includes a base end 26 and two opposing parallel sides 28, 30. On a second edge of the printed wiring board 12 opposite the first edge 20, a pair of slots is provided which extend longitudinally from this second edge. The purpose of the slots is to receive fasteners 38, 40, as subsequently described. The fasteners 38, 48 secure the printed wiring board 12 to the frame of the speedometer 14.

The assembly 10 also includes a pair of spaced guide means 42 for supporting the first edge portion 20 of the board 12 in the predetermined position. The two guide means 42 are identical and therefore only one will be described. The guide means 42 includes vertical positioning means 44 for receiving and guiding the printed wiring board 12 to a predetermined vertical position or, along vertical plane V and horizontal positioning means 46 for receiving and guiding the printed wiring board 12 to a predetermined horizontal position along vertical plane H. In general, the guide means 42 receives the edge 20 of board 12 and means 46 extends through notches 22 to position the board 12 at the predetermined position comprising the predetermined horizontal position and the predetermined vertical position. When in this predetermined position, the fasteners 38, 40 are applied to retain the second edge portion opposite edge 20. The guide means 42 is connected to the frame of the speedometer 14 to secure the printed wiring board 12 thereto.

As best shown in FIG. 3, the vertical positioning means 44 for the board 12 includes a lower guide member 48 and an upper guide member 50. Together members 48 and 50 combine to guide edge 20 of the board 12 in the predetermined desired vertical position. The lower guide member 48 includes an apron portion 52 having an inclined guide surface which is upwardly ramped from a front end 54 to a clamp point 56. As shown in FIG. 2, a rearward portion 57 of the lower guide member 48 is inclined downwardly from the clamp point 56 to the rear end 58 of the guide means 42.

As seen in FIG. 2, the upper guide member 50 is connected at the rear end 58 of the guide means 42 and therefor to the lower guide member 48. The upper guide member 50 includes an extension portion 60 extending partially over the apron 52 and having an inclined under surface extending downward from the forward end shown in FIG. 3 and over the apron 52 toward the clamp point 56. Thus, the printed wiring board 12 is guided between the apron 52 and the extension portion 60 for subsewuent clamping at point 56 at the predetermined vertical level. The upper guide member 50 includes a connection portion 62 which has an inclined under surface descending upwardly from the clamp point 56 to the rear end 58.

In operation, the board 12 is inserted between the apron 52 and the extension portion 60 of the upper guide member 50. This guides the board 12 to the predetermined vertical position or level. The board 12 is clamped between the upper guide member 50 and lower guide member 48 to support the same until fastening thereof. Therefore, the upper surface of the apron 52 and lower surface of the extension portion 60 extend divergently away from one another from the clamp point 56. Also, the interior surfaces of the rearward portion 57 and connection portion 62 extend divergently away from the clamp point 56 toward the rear end 58 of the guide means 42.

The above identified divergence allows the printed wiring board to be initially inserted and positioned at any angular relation to the guide means 42. The portions 57 and 62 have side edges 84, 86, respectively, which extend and ramp from the clamp point 56. The rearward portion 57 and connection portion 62 are hollowed between the side edges 84, 86 so as not to contact the surface of the board 12.

Figure 5:
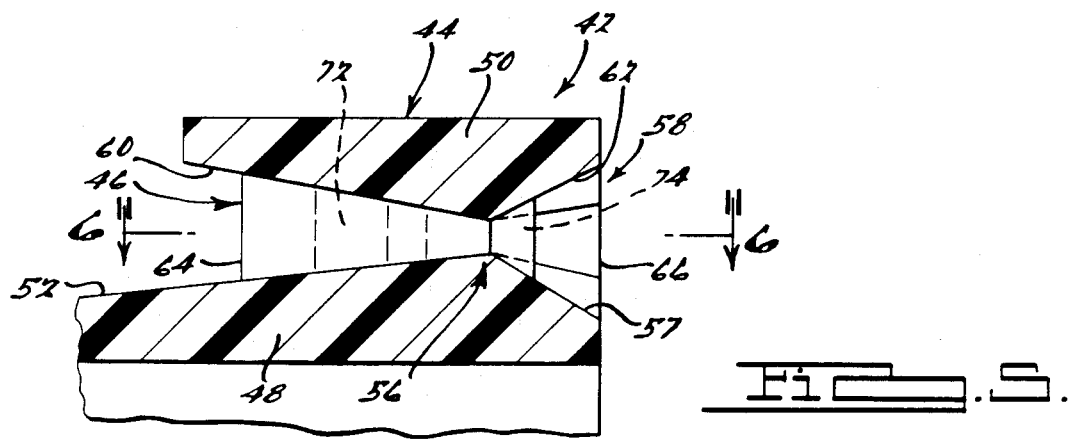
FIG. 5 is a partially cut away side view of the guide means taken along lines 5—5 of FIG. 3.

The horizontal positioning means 46 comprises a guide member having a rounded first end 64 (see FIG. 3) and a second end 66 (see FIG. 2) connected to the rearward portion 58 of the guide means 42, or more specifically, the rearward portion 57 and the connection portion 62. Referring to FIG. 5, the guide means 46 is also connected at its upper surface to upper member 50 and at its lower surface to the lower member 48. As best illustrated in FIG. 6, the horizontal positioning guide 46 includes first side 68 and second side 70 which engage the two parallel sides 28, 30 of the notch 22 to position the board 12 to the predetermined horizontal position. The rounded first end 64 first slides into the notch 22 and subsequently seats against the end 26 for limiting insertion of the board 12.

The guide member 46 is condigured to be somewhat deformable or giving by providing a first tab 72 extending outwardly from the first side 68 near the first end 64. A second tab 74 extends outwardly from the second side 70 near the second end 66. The tabs 72 and 74 are offset from one another along the length of the member 46 from end 64 to end 66. Thereby, the first tab 72 engages and guides one side 28 and the second tab 74 engages and guides the other side 30 of the notch to provide the predetermined horizontal positioning. The two offset tabs 72, 74 may be moved inward by deformation of the guide 46 to accomodate a narrow notch for instance. The tabs maintain a desired gripping force on sides 28, 30 of the notch 22. This ensures a correct horizontal location of the board 12. For purposes of convenience, economy and to provide deformability, the guide means 42 as well as the remainder of the assembly is preferably made of a sturdy but deformable material, such as plastic. Also, the assembly 14 includes a shaft-like support portion 82 which connects the guide means 42 to the frame of the speedometer-odometer assembly.

Once the board 12 has been inserted into the guide means 42, it will be in a proper relation to the electrical mechanism, such as the speedometer-odometer 14, at its predetermined vertical level and predetermined horizontal position. Thereafter, the second opposite edge portion of the board 12 may be fastened to the speedometer 14 by the fasteners 38 and 40.

A pair of housing portions 76 supported by the speedometer-odometer assembly 14 each includes a threaded screw hole 78 therein. The threaded screw hole 78 has a generally longitudinal cross-section in a direction perpendicular to the longitudinal direction of the fastener slots of the printed wiring board 12. When the board 12 is clamped by the guide means 42, the slot will overly the screw hole. The slotted screw hole and the slots in the board 12 allows for tolerance build-up between the board 12 and the frame of the speedometer-odometer assembly 14. The fasteners 38, 40 are preferably in the form of screws and may then be inserted through the slot on the printed wiring board 12 into the screw hole 78 and securely fastened thereto.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims wherein reference numerals are merely for convenience and are not to be in any way limiting, the invention may be practiced otherwise than as specifically described.

What is claimed is:

1. A board guide assembly for receiving a board and aligning the board having a first side along a horizontal plane and a vertical plane, said assembly comprising;

guide means (42) for supporting said first side (20) in a predetermined position;

said guide means (42) including vertical positioning means (44) for receiving and guiding the board (12) to a predetermined vertical position, horizontal positioning means (46) for receiving and guiding the board (12) to a predetermined horizontal position; said vertical positioning means (44) including a lower guide member (48) and an upper guide member (50) for receiving the board (12) therebetween at said predetermined vertical position:

said lower guide member (48) including an apron (52) having an upper guide surface upwardly ramped to a clamp point (56) to guide said board means (12) to said predetermined vertical level; said upper guide member (50) including an extension portion (60) extending partially over said apron (52) and having a downwardly ramping lower surface extending over said apron (52) from said clamp point (56) for guiding said board means (12) between said apron (52) and said extension portion (60) and for clamping the board (12) at said clamp point (56) at said predetermined vertical level.

2. A board guide assembly for receiving a board and aligning the board along a horizontal plane and a vertical plane the board having a notch (22) on a first side (20) of the board (12), the notch (22) having a base end (26) and two parallel sides (28), said assembly comprising;

guide means (42) for supporting said first side (20) in a predetermined position;

said guide means (42) including vertical positioning means (44) for receiving and guiding the board (12) to a predetermined vertical position, horizontal positioning means (46) for receiving and guiding the board (12) to a predetermined horizontal position; said horizontal positioning means (46) comprising a longitudinal deformable guide having a first end (64) and a second end (66) connected to said rearward portion (57) and said connection portion (62), and having first and second sides (68, 70) such that said first end (64) acts against the base end (26) for limiting insertion of the board (12) into said guide means (42), and said first and second sides (68, 70) acting against the two parallel sides (28, 30) to position board (12) to said predetermined horizontal position;

said deformable guide (46) including a first tab (72) extending outwardly from said first side (68) at said first end (64), and a second tab (74) extending outwardly from said second side (70) at said second end (66) such that said first tab (72) engages and guides one of parallel sides (28) and said second tab (74) engages and guides the other of the parallel sides (30).

3. A board guide assembly for receiving a board having a first side and aligning the board along a horizontal plane and a vertical plane, said assembly comprising;

guide means (42) for supporting the first side (20) of the board in a predetermined position;

said assembly characterized by said guide means (42) including vertical positioning means (44) for receiving and guiding the board (12) to a predetermined vertical position, said vertical positioning means (44) including a lower guide member (48) and an upper guide member (50) for receiving the board (12) therebetween at said predetermined vertical position, horizontal positioning means (46) for receiving and guiding the board (12) to a predetermined horizontal position.

4. An assembly as set forth in claim 3 further characterized by said lower guide member (48) including an apron (52) having an upper guide surface upwardly ramped to a clamp point (56) to guide the board (12) to said predetermined vertical level.

5. An assembly as set forth in claim 3 further characterized by said upper guide member (50) including an extension portion (60) extending partially over said apron (52) and having a downwardly ramping lower surface extending over said apron (52) from said clamp point (56) for guiding the board (12) between said apron (52) and said extension portion (60) and for clamping the board (12) at said clamp point (56) at said predetermined vertical level.

6. An assembly as set forth in claim 4 further characterized by said upper guide member (50) including a connection portion (62) upwardly ramping away from said ramp point (56) opposite said extension portion (60).

7. An assembly as set forth in claim 5 further characterized by said lower guide member (48) including a rearward portion (57) extending downwardly from said clamp point (56) in a direction opposite said apron (56).

8. An assembly as set forth in claim 6 further characterized by the board (12) including a notch (22) on the first side having a base end (26) and two parallel sides (28, 30), said horizontal positioning means (46) comprising a longitudinal deformable guide having a first end (64) and a second end (66) connected to said rearward portion (57) and said connection portion (62), and having first and second sides (68, 70) such that said first end (64) acts against base end (26) for limiting insertion of the board (12) into said guide means (42), and said first and second sides (68, 70) acting against the two parallel sides (28, 30) to position the board (12) to said predetermined horizontal position.

9. An assembly as set forth in claim 7 further characterized by said deformable guide (46) including a first tab (72) extending outwardly from said first side (68) at said first end (64), and a second tab (74)extending outwardly from said second side (70) at said second end (66) such that said first tab (72) engages and guides one of the parallel sides (28) and said second tab (74) engages and guides the other of the parallel sides (30).

10. An assembly as set forth in claim 8 further characterized by the board (12) including two of said notches (22, 24) in the first side (20), and including two of said guide means (42) for engaging said notches (22, 24) to support said first side (20).

* * * * *